US008866290B2

(12) United States Patent
Tang et al.

(10) Patent No.: US 8,866,290 B2
(45) Date of Patent: Oct. 21, 2014

(54) MOLDED HEAT SPREADERS

(71) Applicant: Intel Corporation, Santa Clara, CA (US)

(72) Inventors: Zhizhong Tang, Tempe, AZ (US); Syadwad Jain, Chandler, AZ (US); Paul R. Start, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/836,407

(22) Filed: Mar. 15, 2013

(65) Prior Publication Data

US 2014/0264821 A1 Sep. 18, 2014

(51) Int. Cl.
*H01L 23/367* (2006.01)
*B29C 39/10* (2006.01)
*F28F 3/00* (2006.01)

(52) U.S. Cl.
CPC ............... *H01L 23/367* (2013.01); *F28F 3/00* (2013.01); *B29C 39/10* (2013.01)
USPC ........... 257/713; 257/712; 257/723; 257/729; 164/108; 164/185; 164/76.1; 264/261

(58) Field of Classification Search
CPC ............... H01L 2023/4037; H01L 2023/4043; H01L 23/34; H01L 23/36; H01L 23/367; H01L 23/3675; B29C 39/10; F28F 3/00

USPC .................. 257/712, 713, 723, 729; 438/122; 164/108, 185, 76.1; 264/261
See application file for complete search history.

(56) References Cited

U.S. PATENT DOCUMENTS

| 5,276,289 | A * | 1/1994 | Satoh et al. ............... 174/260 |
| 6,269,866 | B1 * | 8/2001 | Yamamoto et al. ...... 165/104.26 |
| 7,345,885 | B2 * | 3/2008 | Boudreaux et al. .......... 361/721 |
| 7,362,583 | B2 * | 4/2008 | Refai-Ahmed et al. ...... 361/719 |

\* cited by examiner

*Primary Examiner* — Peniel M Gumedzoe
(74) *Attorney, Agent, or Firm* — Schwabe, Williamson & Wyatt, P.C.

(57) ABSTRACT

Embodiments of the present disclosure describe techniques and configurations for molded heat spreaders. In some embodiments, a heat spreader includes a first insert having a first face and a first side, the first face positioned to form a bottom surface of a first cavity, and a second insert having a second face and a second side, the second face positioned to form a bottom surface of a second cavity. The second cavity may have a depth that is different from a depth of the first cavity. The heat spreader may further include a molding material disposed between the first and second inserts and coupled with the first side and the second side, the molding material forming at least a portion of a side wall of the first cavity and at least a portion of a side wall of the second cavity. Other embodiments may be described and/or claimed.

25 Claims, 6 Drawing Sheets

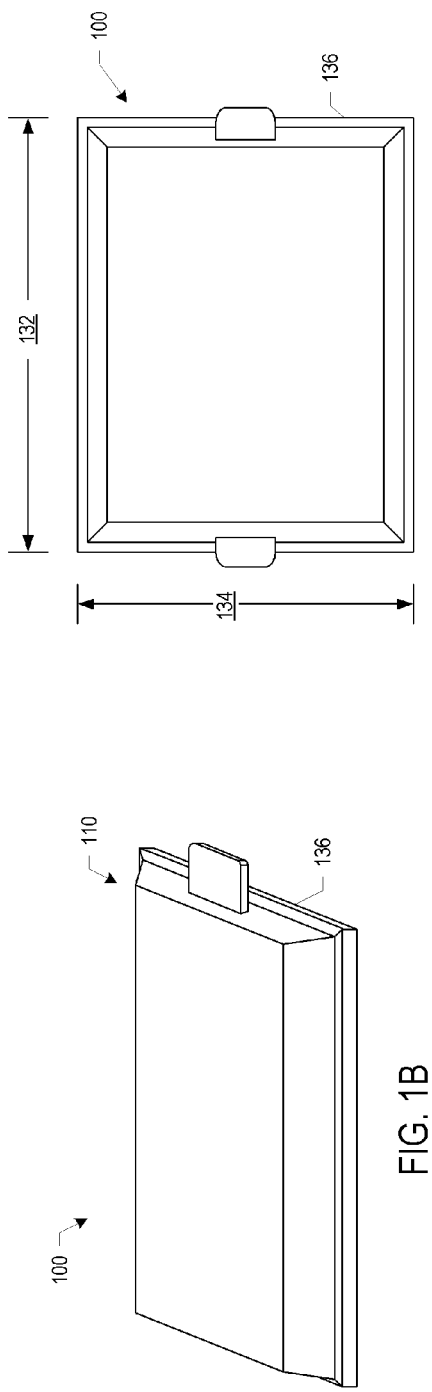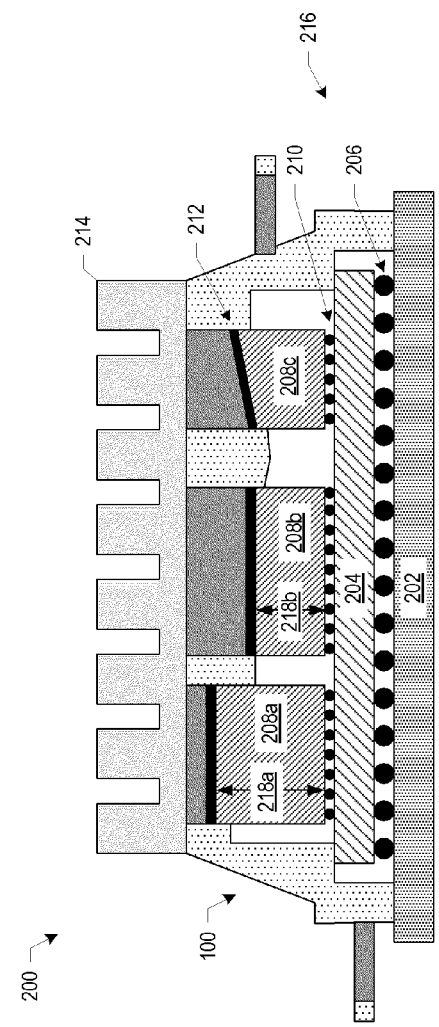

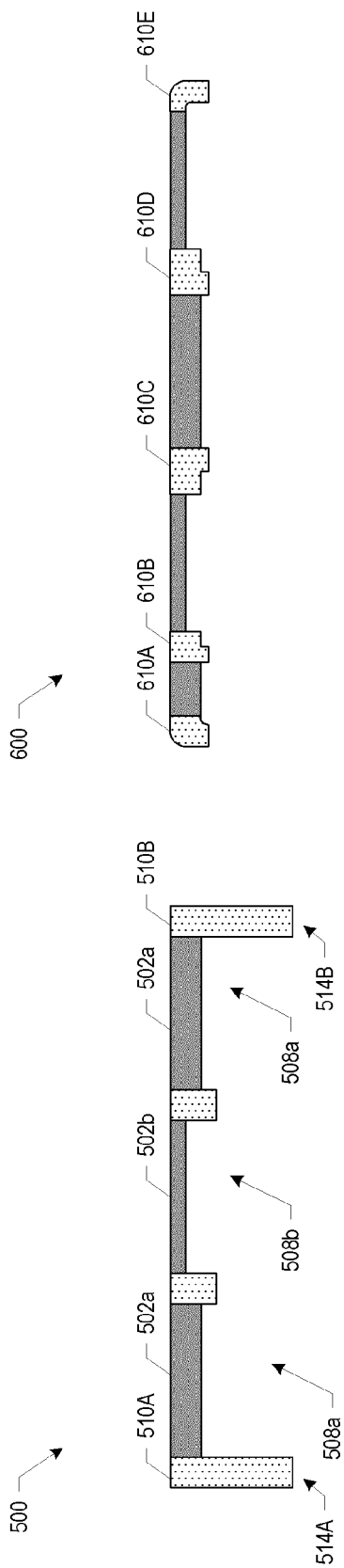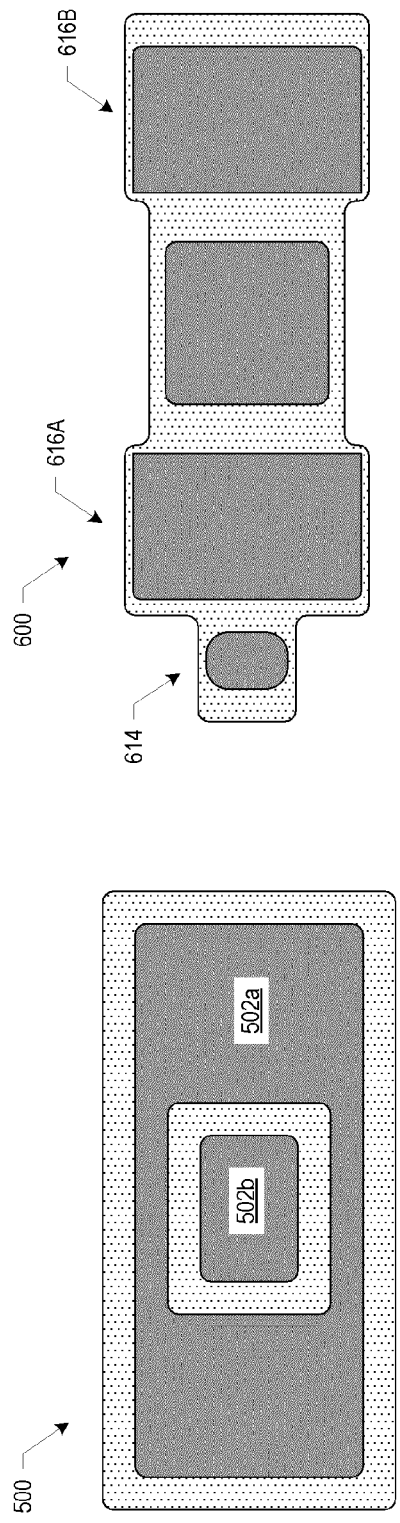

US 8,866,290 B2

MOLDED HEAT SPREADERS

FIELD

Embodiments of the present disclosure generally relate to the field of integrated circuits, and more particularly, to heat spreaders

BACKGROUND

To dissipate potentially damaging heat during operations, integrated circuit (IC) products may include a thermally conductive heat spreader in thermal contact with IC components (such as dies). Existing heat spreaders are typically manufactured by stamping a simple shape into a metal blank. These typical manufacturing techniques may limit the precision, complexity and size of heat spreader designs, which in turn may inhibit the development of new IC package designs.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

FIGS. 1B and 1C are perspective and plan views, respectively, of the heat spreader of FIG. 1A.

FIG. 2 is a cross-sectional side view of an example IC package including the heat spreader of FIGS. 1A-1C, in accordance with some embodiments.

FIGS. 3A-3F schematically illustrate various fabrication operations in the manufacture of the heat spreader 100 of FIGS. 1A-1C, in accordance with some embodiments.

FIGS. 5A and 5B are cross-sectional side and plan views, respectively, of a second example heat spreader, in accordance with some embodiments.

FIGS. 6A and 6B are cross-sectional side and plan views, respectively, of a third example heat spreader, in accordance with some embodiments.

DETAILED DESCRIPTION

Embodiments of the present disclosure describe techniques and configurations for molded heat spreaders and their use in IC packages. In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other.

Figure 1A:
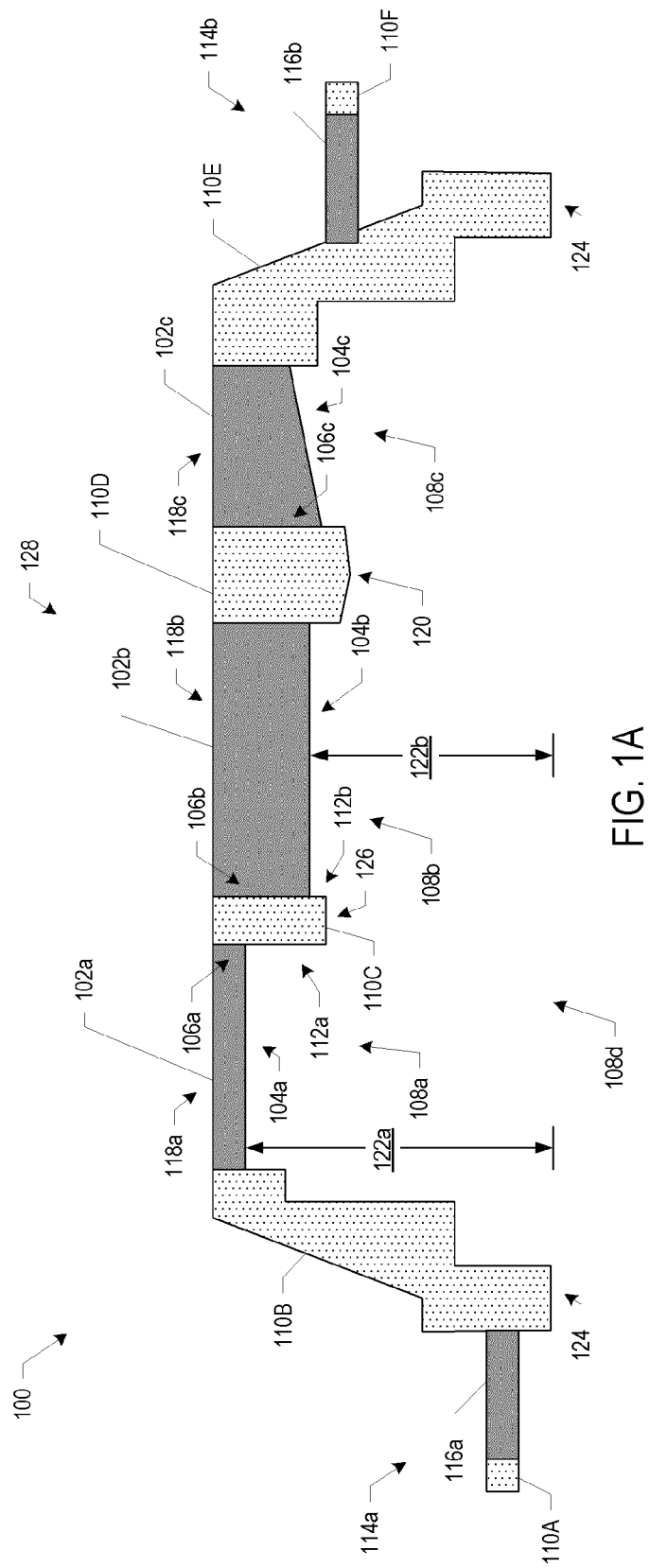
FIG. 1A is a cross-sectional side view of an example heat spreader, in accordance with some embodiments.

FIG. 1A is a cross-sectional side view of an example heat spreader 100, in accordance with some embodiments. In general, the heat spreaders disclosed herein (such as heat spreader 100) may include one or more materials with high thermal conductivity, such as copper, and may serve to conduct heat away from elements of an IC package or other device and spread this heat across a larger geometric area to increase the speed at which the heat radiates into the ambient environment. In some embodiments, the heat spreader 100 may contribute to the mechanical stability of an IC package or other device by distributing a physical load (from e.g., components or forces "above" the heat spreader 100, as oriented in FIG. 1A) to components of an IC package or other device with which the heat spreader is in contact (e.g., "below" the heat spreader 100, as oriented in FIG. 1A). The heat and mechanical load distribution functions are discussed in additional detail below with reference to FIG. 2.

The heat spreader 100 may include one or more inserts; as shown, the heat spreader 100 includes three inserts 102a, 102b and 102c. The depiction of three inserts in FIG. 1A is simply illustrative; various embodiments of the heat spreaders disclosed herein may have one, two, or more inserts. Each insert may have a first face (as shown in FIG. 1A, the first face 104a of the insert 102a, the first face 104b of the insert 102b, and the first face 104c of the insert 102c).

The first face of each insert may be positioned to form a bottom surface of a corresponding cavity. For example, as shown in FIG. 1A, the first face 104a of the insert 102a may form the bottom of a cavity 108a, the first face 104b of the insert 102b may form the bottom of a cavity 108b, and the first face 104c of the insert 102c may form the bottom of a cavity 108c. As shown, the cavities 108a and 108b have different depths 122a and 122b, respectively. The depth of a cavity may be measured from any reference point; as shown, the depths 122a and 122b are measured perpendicular to a plane of a bottom surface 124 of the heat spreader 100, but other reference points (such as the surface 126 of the molding material portion 110C) may be used. The cavities 108a, 108b and 108c are further included in a larger cavity 108d, whose side walls are defined by the molding material portions 110B and 110E (discussed below). The heat spreader 100 is thus an example of a "cavity-in-cavity" configuration.

In some embodiments, two or more cavities included in a heat spreader may have the same depth (e.g., the cavities 508a and 508c of the heat spreader 500 of FIGS. 5A-5B, discussed below). In some embodiments, as illustrated in FIG. 1A by the cavity 108c, a cavity may not have a uniform depth; instead, the bottom of the cavity (which may be formed by a face of an insert, such as the first face 104c of the insert 102c) may be linearly sloped, curved, hyperbolic, bowl-shaped, or any desired shape or combination of shapes. In such embodiments, the depth of the cavity may be represented by the average depth, the minimum depth, the maximum depth, the depth profile, or another suitable representation of depth.

The inserts 102a, 102b and 102c may also have second faces 118a, 118b and 118c, respectively. The second faces 118a, 118b and 118c may be opposite from the first faces 104a, 104b and 104c. In some embodiments, the second faces of two or more inserts may be substantially contained in a common plane; for example, the second faces 118a, 118b and 118c are shown as substantially contained in a common plane in FIG. 1A. The inserts 102a, 102b and 102c may also have sides 106a, 106b and 106c, respectively. As shown in FIG. 1A, in some embodiments, the sides of one or more inserts may be parallel to each other; in other embodiments, the sides of one or more inserts may not be parallel to each other.

The thickness of an insert may be measured perpendicular to the first face and between the first face and the second face; for example, the thickness of the insert 102a may be the perpendicular distance between the first face 104a and the second face 118a. In some embodiments, the thickness of one insert may be different from the thickness of another insert included in a heat spreader; for example, the thickness of the insert 102a may be different from the thickness of the insert 102b, as illustrated in FIG. 1A. In some embodiments, the first face and/or the second face of an insert may not be planar, or may be planar but not parallel, in which cases the thickness of the insert may not be uniform (as illustrated, e.g., by the insert 102a of FIG. 1A). In such embodiments, the thickness of an insert may be represented by the average thickness, the minimum thickness, the maximum thickness, the thickness profile, or another suitable representation of thickness.

In some embodiments, an insert (such as any of the inserts 102a, 102b and 102c) may include a metal. For example, an insert may be formed from copper, aluminum, another metal, or a combination of metals. In some embodiments, an insert may include a ceramic material (e.g., a thermally conductive ceramic, such as SiC, AlSiC, $Al_2O_3$, diamond, etc.). In some embodiments, an insert may include a composite material, such as a combination of any of the materials described above. The choice of materials for use in one or more inserts may be based at least in part on the desired thermal performance of the heat spreader. For example, in some applications with higher thermal performance requirements, a material that has a thermal conductivity of 400 Watts/meter-Kelvin or more (such as copper) may be used in one or more inserts. In less thermally sensitive applications, a material that has a conductivity of less than 400 Watts/meter-Kelvin (such as aluminum) may be used in one or more inserts.

The choice of material for an insert may be based at least in part on other factors instead of or in addition to thermal performance, such as mechanical properties, availability, and/or cost. In some embodiments, different inserts may be formed from the same material or materials; in other embodiments, a first insert (such as the insert 102a) may include additional, fewer, or different materials than a second insert (such as either of the inserts 102b and 102c).

The heat spreader 100 may include a molding material 110. In some embodiments, the molding material 110 may be distributed in various portions of the heat spreader 100, as indicated in the cross-section of FIG. 1A by molding material portions 110A, 110b, 110C, 110D, 110E and 110F. In some embodiments, the molding material 100 may be disposed between two inserts. For example, the molding material portion 110C may be disposed between the insert 102a and the insert 102b, and the molding material portion 110D may be disposed between the insert 102b and the insert 102c. In some embodiments, the molding material may be coupled with sides of the inserts. For example, the molding material portion 110C may be coupled with the side 106a of the insert 102a and the side 106b of the insert 102b. In some embodiments, the molding material 100 may secure one or more of the inserts 102a, 102b and 102c to the heat spreader 100.

In some embodiments, the molding material may form at least a portion of a side wall of one or more cavities in the heat spreader. For example, the molding material portion 110C forms a portion of the side wall 112a of the cavity 108a, and a portion of the side wall 112b of the cavity 108b. The shapes of the side walls 112a, 112b and 112c of the cavities 108a, 108b and 108c, respectively, may at least partially conform to the sides 106a, 106b and 106c of the inserts 102a, 102b and 102c forming the bottoms of the cavities 108a, 108b and 108c, respectively. In some embodiments, the shapes of molding material portions may be planar, curved, or any other shape; for example, the surface 126 of the molding material portion 110C is depicted as substantially planar, while the surface 120 of the molding material portion 110D is depicted as curved.

As discussed above with reference to inserts (e.g., the inserts 102a, 102b and 102c of FIG. 1A), the choice of a molding material (e.g., the molding material 110) may be based at least in part on the desired thermal performance of the heat spreader 100. For example, in some applications with higher thermal performance requirements, the molding material may include a material with a sufficiently high thermal conductivity (such as a metal alloy). In applications with lower thermal performance requirements, the thermal conductivity of the molding material may be less important or unimportant, and the molding material may be selected largely based on other factors, such as mechanical properties, availability, and/or cost.

In some embodiments, a material for the molding material may be selected based at least in part on the modulus of elasticity of the material in order to achieve a desired load-bearing performance for the heat spreader. For example, in some embodiments, the molding material 110, when set, may be selected to have a modulus of elasticity that is greater than or equal to the modulus of elasticity of one or more of the inserts 102a, 102b and 102c. In some embodiments, a material for the molding material may be selected based at least in part on the material's creep behavior in order to maintain the deformation of the heat spreader over time within an acceptable range.

The selection of material(s) for the molding material (e.g., the molding material 110) and one or more inserts (e.g., any of the inserts 102a, 102b and 102c) may be related. For example, in some applications, it may be advantageous to reduce the risk of delamination of the molding material from the inserts to ensure the mechanical reliability of the heat spreader. In such applications, the materials for the molding material and the inserts may be selected to have a desired level of adhesion. In some applications, the heat spreader may include mechanical features, such as tabs in the molding material that hold one or more of the inserts, to improve mechanical reliability (instead of or in addition to selecting the molding material and the inserts for complementary adhesion).

In another example, in some applications, it may be advantageous to reduce the mismatch between the coefficients of thermal expansion (CTEs) of the molding material (e.g., the molding material 110) and one or more inserts (e.g., any of the inserts 102a, 102b and 102c) in order to prevent mechanical damage when the heat spreader is heated. In such applications, the materials for the molding material and the inserts may be selected to have CTEs within a desired range. In some embodiments, a molding material may be formed by combining a resin material with an additional material having a lower CTE (such as metal particles) to better match the CTE of the molding material to inserts formed from lower CTE materials (such as metals).

The molding material 110 may also form peripheral structures of the heat spreader 100. For example, the molding material portions 110B and 110E may form side walls of the heat spreader 100. The shapes of the molding material portions 110B and 110E may be selected based on the shape of an IC package or other device with which the heat spreader 100 may be coupled during use (e.g., as discussed below with reference to FIG. 2). The molding material portions 110B and 110E may provide the boundaries of a body portion 128 of the heat spreader 100.

In some embodiments, one or more handling tabs may extend from a body portion of a heat spreader. For example, the handling tabs 114a and 114b of the heat spreader 100 extend from the body portion 128. Handling tabs may be dimensioned for manipulation by a finger of a human user, and may be manipulated by the human user to, for example, grasp the heat spreader 100 or lift the heat spreader 100 from an IC package or other device with which the head spreader 100 is coupled. A handling tab may include one or more inserts; for example, the handling tab 114a includes the insert 116a and the handling tab 114b includes the insert 116b. In some embodiments, a handling tab may not include an insert. The insert 116a of the handling tab 114a may be secured to the body portion 128 of the heat spreader 100 by a molding material portion 110A, while the insert 116b of the handling tab 116b may be secured to the body portion 128 of the heat spreader 100 by a molding material portion 110F.

FIGS. 1B and 1C are perspective and plan views, respectively, of the heat spreader 100 of FIG. 1A. As shown in FIG. 1B, in some embodiments, the molding material 110 may extend around a perimeter boundary 136 of the heat spreader 100. As shown in the plan view of FIG. 1B, the perimeter boundary 136 of the heat spreader 100 may define a footprint of the heat spreader 100. In some embodiments, one or more of the dimensions 132 and 134 of the footprint of the heat spreader 100 may be greater than or equal to approximately 80 millimeters (mm). In some embodiments, one or more of the dimensions 132 and 134 of the footprint of the heat spreader 100 may be greater than or equal to approximately 150 millimeters (mm). In some embodiments, the footprint may have an area greater than or equal to approximately 1600 mm².

FIG. 2 is a cross-sectional side view of an example IC package 200 including the heat spreader 100 of FIGS. 1A-1C, in accordance with some embodiments. The IC package 200 may include a substrate 216 to which one or more IC components (such as the IC components 208a, 208b and 208c) may be coupled. The IC components 208a, 208b and 208c may be electrically and/or mechanically coupled to the substrate 216 using first-level interconnects 210. In various embodiments, first-level interconnects 210 may include solder bumps, copper pillars, or other conductive elements. As shown in FIG. 2, the substrate 216 may include an interposer 202. In some embodiments, the interposer 202 may include a number of electrical pathways to route signals between one or more components of IC package 200 disposed above the interposer (e.g., the patch 204 or from one or more of the IC components 208a, 208b and 208c) to one or more components disposed below the interposer 202 (e.g., a motherboard or other circuit board, not shown). In some embodiments, the substrate 216 may include a patch 204. The patch 204 may be positioned between the IC components 208a, 208b and 208c and the interposer 202, and may support routing and power and/or signal delivery functions of the IC package 200. In some embodiments, the patch 204 and the interposer 202 may be attached vertically together in the IC package 200 and may together serve as the substrate 216. In some embodiments, the patch 204 and/or the interposer 202 may be laminated materials with copper traces on the interior for power and/or signal delivery. The patch 204 may be electrically and/or mechanically coupled to the interposer 202 using second-level interconnects 206. In various embodiments, second-level interconnects 206 may include solder bumps, copper pillars, or other conductive elements. In some embodiments, the size and configuration of the patch 204 may vary depending upon the device into which the IC package 200 is incorporated (e.g., a low, medium, or high-end server).

In some embodiments, the substrate 216 may not include an interposer and/or a patch. For example, the substrate 216 may include a stack of thin layers or laminates that have a high modulus of elasticity and a low mismatch between the CTE of the substrate materials and the CTE(s) one or more other portions of the IC package 200. Such embodiments of substrate 216 may provide advantageous package reliability. In some embodiments, substrate 216 may include organic materials such as glass-reinforced epoxy laminate or resin-based Bismaleimide-Triazine (BT). In some embodiments, substrate 216 may include ceramic materials such as aluminum oxide, silicon nitride or silicon carbide. In some embodiments, the substrate 216 may include a package substrate directly and/or electrically coupled with one or more of IC components 208a, 208b and 208c. For example, the IC components 208a, 208b and 208c may each be mounted on the package substrate. In some embodiments, the package substrate may be electrically coupled with a circuit board (e.g., motherboard 702 of FIG. 7). In still other embodiments, the substrate 216 may include a circuit board directly or electrically coupled with the IC components 208a, 208b and 208c.

The IC package 200 may include the heat spreader 100 of FIGS. 1A-1C. As shown in FIG. 2, portions of the IC components 208a, 208b and 208c may extend into the cavities 108a, 108b and 108c, respectively, of the heat spreader 100. In some embodiments, the height of an IC component may be complementary or may otherwise correspond to the depth of the cavity into which the IC component extends. For example, the IC component 208a may have a height 218a measured, for example, perpendicular to a surface of the substrate 216. The IC component 208b may have a height 218b measured perpendicular to a surface of the substrate 216. As shown in FIG.

2, the height 218a of the IC component 208a may be greater than the height 218b of the IC component 218b. For example, the IC component 208a may be a memory stack and the IC component 208b may be a central processing unit die.

To accommodate these different heights, the depth 122a of the cavity 108a (FIG. 1A), into which the IC component 208a extends, may be less than the depth 122b of the cavity 108b (FIG. 1A), into which the IC component 208b extends. In some embodiments, as illustrated in FIG. 2 by the IC component 208c, an IC component may not have a uniform height; instead, the "upper" portion of an IC component may be linearly sloped, curved, hyperbolic, bowl-shaped, or any desired shape or combination of shapes. In such embodiments, the height of the IC component may be represented by the average height, the minimum height, the maximum height, the height profile, or another suitable representation of height.

In some embodiments, one or more of the IC components 208a, 208b and 208c may be in thermal contact with the bottom surfaces of the cavities 108a, 108b and 108c, respectively (the bottom surfaces formed by the inserts 102a, 102b and 102c, respectively, as discussed above with reference to FIG. 1A). In some such embodiments, a thermal interface material is disposed between an IC component and a bottom surface of a cavity of the heat spreader; for example, the thermal interface material 212 is disposed between the IC component 208c and the bottom surface of the cavity 108c of the heat spreader 100. Heat generated by the IC component 208c may be conducted through the thermal interface material 212 to the heat spreader 100. One or more cavities of the heat spreader 100 may include a thermal interface material in the IC package 200. Examples of thermal interface materials include polymer-based thermal interface materials and solid, pre-formed solder thermal interface materials.

In some embodiments, the IC package 200 may also include a heat sink 214 disposed on the heat spreader 100, which may further assist in conducting heat away from the IC package 200 and into the ambient environment. As discussed above with reference to FIG. 1A, the heat spreader 100 may serve to distribute mechanical load from forces "above" the heat spreader 100 (e.g., the weight of the heat sink 214 or forces from other components coupled with the heat spreader 100) to the substrate 216 of the IC package 200. In particular, the heat spreader 100 may be configured to contact the substrate 216 at portions of the substrate 216 that may appropriately bear the load. In some embodiments, the heat spreader 100 may be coupled to the substrate by a sealant (not shown), such as a silicon-based polymer.

In some embodiments, the load transfer ability of the heat spreader 100 may help to ensure that a uniform downward force is applied to the IC package 200 to ensure that any pins or other mechanical connectors between the IC package 200 and other components are sufficiently seated to aid the reliability of the connections. Each of these pins may represent, for example, an input-output signal pathway, and the IC package 200 may include hundreds or thousands of such pins (not shown). In some embodiments, the heat spreader may be coupled with one or more of the patch 204 and the interposer 202 to improve the distribution of load across components of the IC package 200.

In some embodiments, the heat spreaders disclosed herein (such as heat spreader 100 of FIGS. 1A-1C) may be fabricated using insert-molding technology. In particular, one or more inserts (such as the inserts of FIGS. 1A-1C) may be placed in a heat spreader mold, after which a fluid molding material may be injected into the mold. In some embodiments, the molding material is heated until fluid; in such embodiments, the melting point of the insert material may be higher than the melting point of the molding material. When the molding material sets into a solid form, the heat spreader is removed from the mold as a unitary body, including the molding material and the one or more inserts, in the shape dictated by the shape of the mold.

Figure 3A:
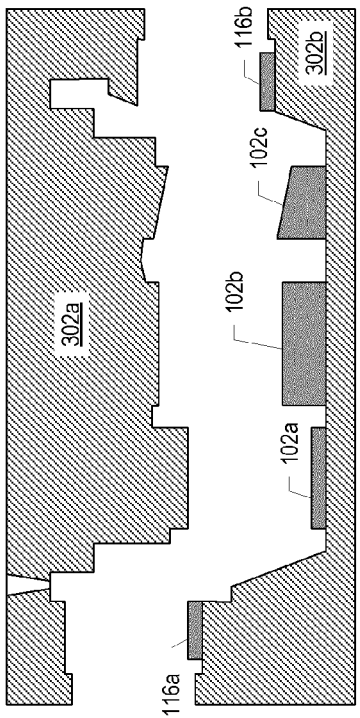

FIGS. 3A-3F schematically illustrate various fabrication operations in the manufacture of the heat spreader 100 of FIGS. 1A-1C, in accordance with some embodiments. Referring to FIG. 3A, a heat spreader mold 302 is illustrated having components 302a and 302b separated to expose the inner surfaces 308a and 308b, respectively. The shapes of the inner surfaces 308a and 308b are selected based on the desired form of the heat spreader 100. In particular, the heat spreader mold 302 may include cavity portions corresponding to one or more cavities included in the heat spreader 100; for example, the cavity portion 310a (indicated by the dotted line) may correspond to the cavity 108a (FIG. 1A) and the cavity portion 310b (indicated by the dotted line) may correspond to the cavity 108b (FIG. 1A).

Figure 3B:
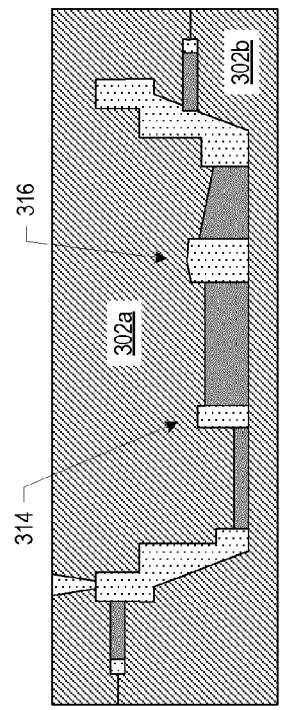

Referring to FIG. 3B, the heat spreader mold 302 is illustrated after the inserts 102a, 102b, 102c, 116a and 116b have been provided in the heat spreader mold 302. Some of the inserts may be provided in portions of the mold corresponding to cavities; for example, the insert 102a may be provided in the cavity portion 310a and the insert 102b may be provided in the cavity portion 310b. In particular, inserts 102a, 102b and 102c may be positioned in the heat spreader mold 302 such that a face of each insert is positioned to form a bottom surface of a corresponding cavity in the heat spreader 100 (e.g., as discussed above with reference to FIG. 1A). As discussed above, in some embodiments, one or more of the inserts 102a, 102b, 102c, 116a and 116b may include a metal, a ceramic material or a composite material.

In some embodiments, one or more of the inserts 102a, 102b, 102c, 116a and 116b may be formed by stamping a roll or other raw material prior to being provided in the heat spreader mold 302. In some embodiments, one or more of the inserts 102a, 102b, 102c, 116a and 116b may be formed by one or more other manufacturing operations prior to being provided in the heat spreader mold 302.

Figure 3C:
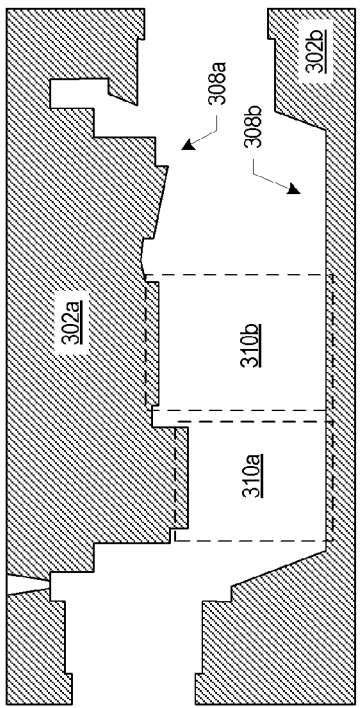

Referring to FIG. 3C, the heat spreader mold 302 is illustrated after the components 302a and 302b are brought together and a molding material delivery system 306 has been positioned to provide the molding material 110 to the interior of the heat spreader mold 302. In some embodiments, the molding material 110 may include an aluminum alloy, a zinc alloy, or a magnesium alloy. In some embodiments, the molding material 110 may include a resin or an epoxy-based composite.

In some embodiments, the molding material delivery system 306 may include a hopper into which the molding material 110 is loaded and which provides the molding material 110 to a delivery barrel. The molding material 110 may be heated in the delivery barrel and forced through the barrel to the heat spreader mold 302 by a screw or other displacement mechanism. The molding material 110 may be injected in fluid form into the heat spreader mold 302 in accordance with an insert molding process. Any suitable molding material delivery system known in the art may serve as the molding material delivery system 306. Although only one inlet 312 is depicted in FIG. 3C, one or more inlets may be included in the heat spreader mold 302 and used for the delivery of the molding material 110.

Referring to FIG. 3D, the heat spreader mold 302 is illustrated after the molding material 110 has been provided to the interior of the heat spreader mold 302. In particular, the molding material 110 is illustrated as provided to the portions 314 and 316 of the heat spreader mold between the cavity portions 310a and 310b.

Figure 3E:
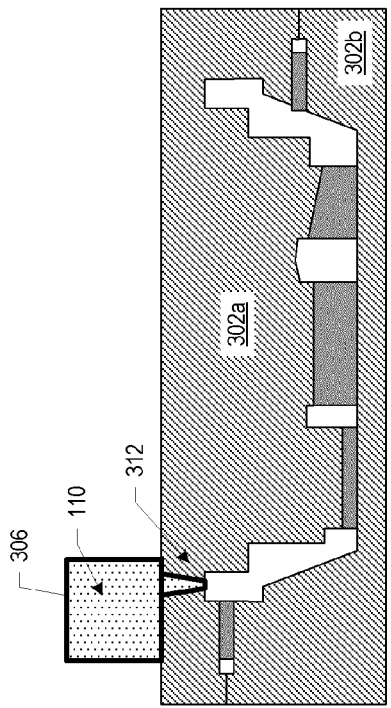

Referring to FIG. 3E, the heat spreader 100 is illustrated after the molding material 110 has set and the heat spreader 100 (a unitary piece including the inserts and the set molding material) is removed from the heat spreader mold 302. In some embodiments, the heat spreader 100 may be inspected and further machined upon removal from the heat spreader mold 302.

Figure 3E:
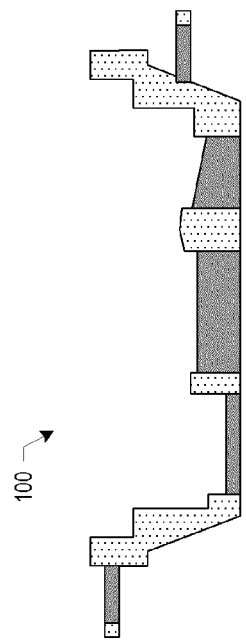
Figure 3F:
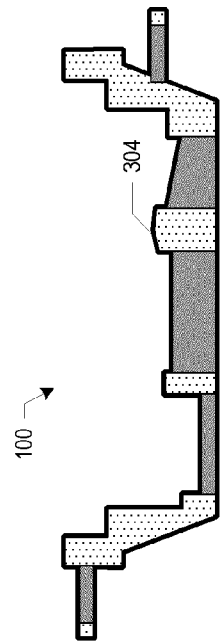

Referring to FIG. 3F, the heat spreader 100 is illustrated after plating with a metal. In some embodiments, the plating material comprises nickel. In various embodiments, only a portion of the heat spreader 100 is plated, or the heat spreader 100 is not plated at all.

The heat spreader configurations and techniques disclosed herein may be used to provide heat spreaders having footprint dimensions of 80 mm by 80 mm, or larger. Such "large" heat spreaders may enable the use and development of large IC packages by providing advantageous thermal management not achievable using existing manufacturing technologies. The heat spreader configurations and techniques disclosed herein may also be used to manufacture heat spreaders with more complicated designs (e.g., chamfered corners, three-dimensional features, wing features, multiple cavities, cavities-within-cavities, etc.) than are achievable using existing manufacturing technologies.

For example, some existing heat spreaders are manufactured by stamping a metal blank into a desired shape using a high tonnage press. The tonnage required to deform a metal blank into a simple heat spreader design increases significantly as the footprint of the design increases; an 80 mm by 80 mm heat spreader, for example, may require approximately 600 tons of force or more. The required tonnage further increases with the complexity of the heat spreader design. High tonnage presses are extremely expensive, and may be prohibitively expensive or simply unavailable for low or medium volume operations. Additionally, the manufacturing throughput of high tonnage presses is small, limiting the rate at which heat spreaders may be produced, and consequently increasing the cost to the end consumer. Moreover, even when a high tonnage press is accessible, such presses may be constrained by large manufacturing tolerances, and thus may not be able to successfully and accurately produce certain advantageous heat spreader structures (such as cavity-in-cavity) and fine design features. Alternatives to stamping, such as welding or brazing, require many separate manufacturing steps, often performed by hand, and may not be able to achieve the precision, throughput and cost objectives for heat spreaders used in IC packages.

By utilizing molding technology, such as insert molding, the heat spreaders disclosed herein may be designed and manufactured with a greater range of possible sizes and achievable design complexities, and with higher precision and lower cost, than traditional heat spreaders. Achieving tighter tolerances may also enable the heat spreaders disclosed herein to more precisely cover desired IC package components without the wide corners characteristic of high tolerance stamping technology, which may further free up valuable space on a circuit board or within an electronic device. Further, in embodiments of the heat spreaders disclosed herein in which the molding material has a lower density than the one or more inserts in the heat spreader, the overall weight of the heat spreader may be reduced from the weight of similar heat spreaders stamped entirely out of the insert material. Such lower weight heat spreaders may present a reduced risk of crushing or otherwise damaging the connectors used to attach IC packages to other surfaces (e.g., ball grid array connectors or surface mounts). Reducing the weight of heat spreaders may be particularly advantageous as the footprint of the heat spreader increases in size.

Figure 4:
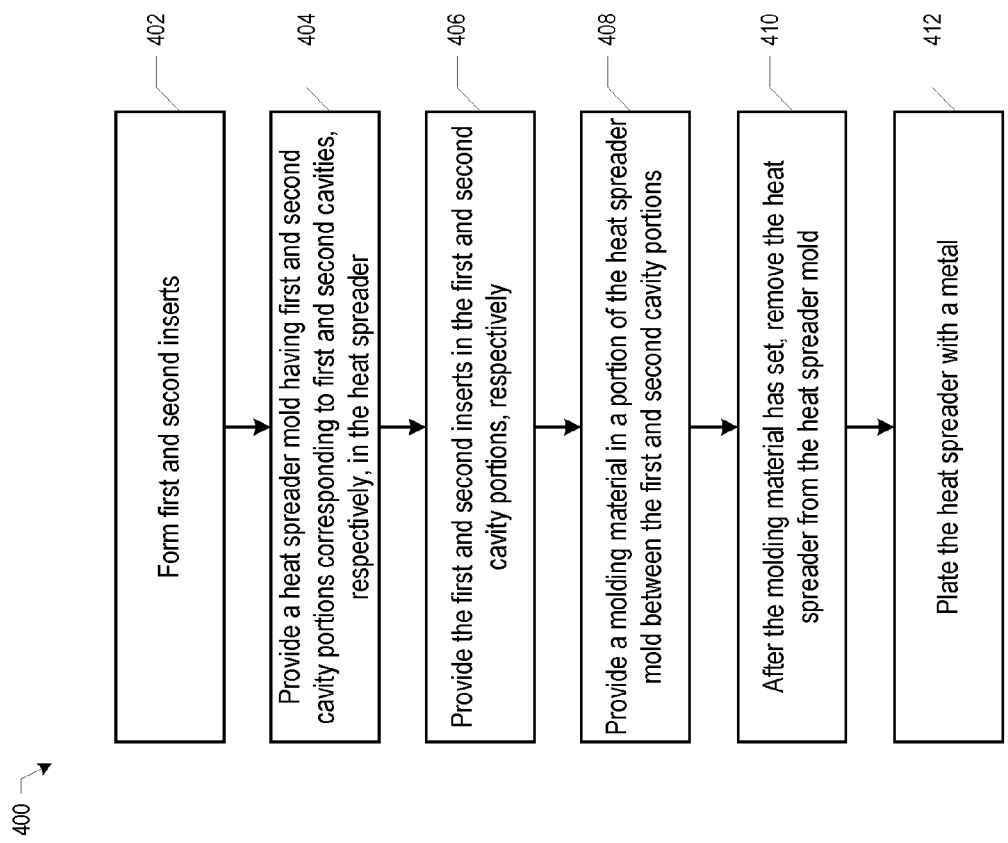
FIG. 4 is a flow diagram of a method of fabricating a heat spreader, in accordance with some embodiments.

FIG. 4 is a flow diagram 400 of a method of fabricating a heat spreader, in accordance with some embodiments. The method of flow diagram 400 may comport with actions described in connection with FIGS. 1, 2 and 3A-3F, in some embodiments. Various operations are described as multiple discrete operations in turn for illustrative purposes; the order of description should not be construed as to imply that these operations are necessarily order dependent.

At 402, first and second inserts may be formed. In some embodiments, one or more of the first and second inserts may be cut from a roll or other sheet of material (e.g., a roll of copper foil). In some embodiments, the first and second inserts may be formed by stamping the first and/or second inserts from a roll, sheet, blank, or other material. In some embodiments, the first and/or second insert may include a metal, a ceramic material, or a composite material.

At 404, a heat spreader mold may be provided. The heat spreader mold may have first and second cavity portions corresponding to first and second cavities, respectively, in the heat spreader.

At 406, the first and second inserts may be provided in the first and second cavity portions, respectively, of the heat spreader mold. The first and second inserts may be provided such that a face of the first insert is positioned to form a bottom surface of the first cavity in the heat spreader and a face of the second insert is positioned to form a bottom surface of the second cavity in the heat spreader.

At 408, a molding material may be provided in a portion of the heat spreader mold between the first and second cavity portions. In some embodiments, 408 may include injecting the molding material in fluid form using an insert molding process. In some embodiments, the molding material may include an aluminum alloy, a zinc alloy, or a magnesium alloy. In some embodiments, the molding material may include a resin or an epoxy-based composite. In some embodiments, the molding material, when set, may have a modulus of elasticity that is greater than or equal to the modulus of elasticity of the first and/or second inserts.

At 410, after the molding material has set, the first and second inserts and the set molding material may be removed from the heat spreader mold as the heat spreader.

At 412, after removing the heat spreader from the heat spreader mold at 410, the heat spreader may be plated with a metal.

The heat spreader 100 of FIGS. 1A-1C includes a number of structures that may be included in a heat spreader constructed in accordance with the techniques and configurations disclosed herein, but is simply illustrative. FIGS. 5A and 5B, and 6A and 6B, are cross-sectional side and plan views of additional examples of heat spreaders in accordance with those disclosed herein.

The heat spreader 500 of FIGS. 5A and 5B includes two cavities 508a and 508b. The bottom surfaces of the cavities 508a and 508b are defined by inserts 502a and 502b, respectively. The thickness of the inserts 502a may be greater than the thickness of the insert 502b. A molding material 510 may be used to provide, at least in part, side walls between the cavities 508a and 508b. As shown in FIG. 5B, the cavity 508b is positioned within the cavity 508a. This is another example of the "cavity-in-cavity" configurations discussed herein. FIG. 5B depicts the insert 502a as a unitary body with a hole in the middle, but in some embodiments, the insert 502a may be formed from two or more separate components.

The molding material portions 510A and 510B of the heat spreader 500 may be formed as elongated "legs" which, when the heat spreader 500 is positioned in an IC package, may be secured at the surfaces 514A and 514B, respectively, to a substrate or other component.

The heat spreader 600 of FIGS. 6A and 6B includes four cavities 608a, 608b, 608c and 608d, having bottom surfaces defined by the inserts 602a, 602b, 602c and 602d, respectively. One or more of the inserts 602a, 602b, 602c and 602d may have different thicknesses. The shapes of the side walls between the cavities may vary between pairs of cavities; for example, the molding material portion 610B may have a different shape than the molding material portion 610C. The molding material portions 610A and 610D at the ends of the heat spreader 600 may not be as extended as the molding material portions 510A and 510B of the heat spreader 500 (FIGS. 5A and 5B), and may have a curved profile. As shown in FIG. 6B, the footprint of the heat spreader 600 may not be substantially rectangular, and may include "wing" shapes as illustrated by the portions 616A and 616B, and/or a handling portion 614.

Figure 7:
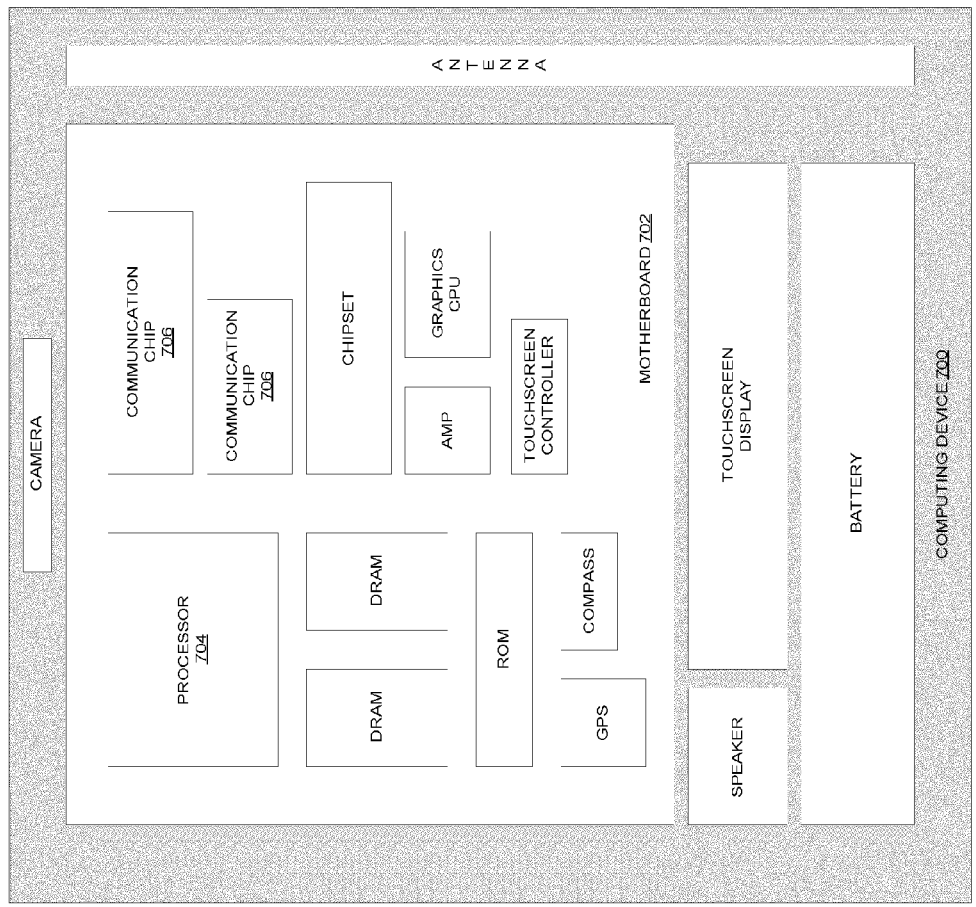
FIG. 7 schematically illustrates a computing device that may include a heat spreader, in accordance with some embodiments.

Embodiments of the present disclosure may be implemented into a system using any suitable hardware and/or software to configure as desired. FIG. 7 schematically illustrates a computing device 700 in accordance with some implementations. The computing device 700 may house a board such as motherboard 702. The motherboard 702 may include a number of components, including but not limited to a processor 704 and at least one communication chip 706. The processor 704 may be physically and electrically coupled to the motherboard 702. In some implementations, the at least one communication chip 706 may also be physically and electrically coupled to the motherboard 702. In further implementations, the communication chip 706 may be part of the processor 704.

Depending on its applications, computing device 700 may include other components that may or may not be physically and electrically coupled to the motherboard 702. These other components may include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth).

The communication chip 706 may enable wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible BWA networks are generally referred to as WiMAX networks, an acronym that stands for Worldwide Interoperability for Microwave Access, which is a certification mark for products that pass conformity and interoperability tests for the IEEE 802.16 standards. The communication chip 706 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 706 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 706 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 706 may operate in accordance with other wireless protocols in other embodiments.

The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

The processor 704 of the computing device 600 may include a die (e.g., included in any of IC components 200 of FIG. 2) in an IC package (e.g., IC package 200 of FIG. 2) as described herein. For example, the substrate 216 may be coupled with a circuit board such as the motherboard 702 using package-level interconnects such as, for example, solder balls or other suitable techniques. The term "processor" may refer to any device or portion of a device that processes electronic data from registers and/or memory to transform that electronic data into other electronic data that may be stored in registers and/or memory.

The communication chip 706 may also include a die (e.g., included in any of IC components 200 of FIG. 2) in an IC package (e.g., IC package 200 of FIG. 2) as described herein. In further implementations, another component (e.g., memory device or other integrated circuit device) housed within the computing device 700 may contain a die (e.g., included in any of IC components 200 of FIG. s) in an IC package (e.g., IC package 200 of FIG. 2) as described herein. Such dies may be configured to send or receive signals through a bridge interconnect structure as described herein.

In various implementations, the computing device 700 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data. In some embodiments, the heat spreaders and IC packages described herein are implemented in a high-performance computing device. In some embodiments, the heat spreaders and IC packages described herein are implemented in handheld computing devices.

The above description of illustrated implementations, including what is described in the Abstract, is not intended to be exhaustive or to limit the disclosure to the precise forms disclosed. While specific implementations are described herein for illustrative purposes, various equivalent modifications are possible within the scope of the disclosure, as those skilled in the relevant art will recognize.

These modifications may be made to the disclosed embodiments in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

The following paragraphs provide a number of examples of embodiments of the present disclosure. In a first set of examples, a method of fabricating a heat spreader is provided. The method may include: providing a heat spreader mold having first and second cavity portions corresponding to first and second cavities, respectively, in the heat spreader; providing first and second inserts in the first and second cavity portions, respectively, of the heat spreader mold such that a face of the first insert is positioned to form a bottom surface of the first cavity in the heat spreader and a face of the second insert is positioned to form a bottom surface of the second cavity in the heat spreader; providing a molding material in a portion of the heat spreader mold between the first and second cavity portions; and after the molding material has set, removing the first and second inserts and the set molding material from the heat spreader mold as the heat spreader. The first insert may include a metal, a ceramic material or a composite material. The molding material may include an aluminum alloy, a zinc alloy, or a magnesium alloy. The molding material may include a resin or an epoxy-based composite. The set molding material may have a modulus of elasticity that is greater than or equal to a modulus of elasticity of the first insert. The method may further include, after removing the heat spreader from the heat spreader mold, plating the heat spreader with a metal. The method may further include, prior to providing the first and second inserts in the heat spreader mold, forming the first and second inserts by stamping. Providing the molding material may include injecting the molding material in fluid form using an insert molding process. Any of the foregoing examples in the first set of examples may be taken in any combination to provide additional examples of embodiments of the present disclosure.

In a second set of examples, a heat spreader is provided. The heat spreader may include: a first insert having a first face and a first side, the first face positioned to form a bottom surface of a first cavity; a second insert having a second face and a second side, the second face positioned to form a bottom surface of a second cavity and the second cavity having a depth that is different from a depth of the first cavity; and a molding material disposed between the first and second inserts and coupled with the first side and the second side, the molding material forming at least a portion of a side wall of the first cavity and at least a portion of a side wall of the second cavity. The heat spreader may have a footprint defined by a perimeter boundary, and a dimension of the footprint is greater than or equal to approximately 80 millimeters (mm). The dimension of the footprint may be greater than or equal to approximately 150 mm. The heat spreader may have a footprint defined by a perimeter boundary, and the footprint has an area greater than or equal to approximately 1600 mm$^2$. The first and second inserts may be included in a body portion of the heat spreader, and the heat spreader may further include a handling tab extending from the body portion and dimensioned for manipulation by a finger of a human user. The first insert may have a thickness, measured perpendicular to the first face, which is different from a thickness of the second insert, measured perpendicular to the second face. The first insert may have a second face opposite from the first face of the first insert, the second insert may have a second face opposite from the first face of the second insert, and the second faces of the first and second inserts may be contained in a common plane. The molding material may extend around a perimeter boundary of the heat spreader. The heat spreader may further include one or more additional inserts positioned to form bottom surfaces of corresponding one or more additional cavities. The first cavity may be positioned within the second cavity. Any of the foregoing examples in the first set of examples may be taken in any combination to provide additional examples of embodiments of the present disclosure.

In a third set of examples, an integrated circuit (IC) package is provided. The IC package may include: a substrate; a heat spreader having first and second cavities, the first and second cavities having respective first and second bottom surfaces, the first bottom surface defined by a first insert, the second bottom surface defined by a second insert, the first insert and the second insert being secured in the heat spreader by a molding material; and first and second IC components coupled with a surface of the substrate and positioned between the substrate and the heat spreader, wherein portions of the first and second IC components extend into the first and second cavities, respectively, of the heat spreader. The first and second IC components may be in thermal contact with the first and second bottom surfaces, respectively. A thermal interface material may be disposed between the first and second IC components and the first and second bottom surfaces, respectively. The first IC component may have a first height, measured perpendicular to the surface of the substrate, the second IC component may have a second height, measured perpendicular to the surface of the substrate, and the first height may be greater than the second height, and the first cavity may have a first depth, measured perpendicular to the first bottom surface, the second cavity may have a second depth, measured perpendicular to the second bottom surface, and the first depth may be less than the second depth. The first IC component may include a memory stack and the second IC component may include a CPU die. The substrate may include an interposer. A patch may be positioned between the first IC component and the interposer. Any of the foregoing examples in the first set of examples may be taken in any combination to provide additional examples of embodiments of the present disclosure.

What is claimed is:

1. A method of fabricating a heat spreader, comprising:
providing a heat spreader mold having first and second cavity portions corresponding to first and second cavities, respectively, in the heat spreader;
providing first and second inserts in the first and second cavity portions, respectively, of the heat spreader mold such that a face of the first insert is positioned to form a bottom surface of the first cavity in the heat spreader and a face of the second insert is positioned to form a bottom surface of the second cavity in the heat spreader;
providing a molding material in a portion of the heat spreader mold such that the molding material is disposed between the first and second inserts and coupled with a first side of the first insert and a second side of the second insert; and
after the molding material has set, removing the first and second inserts and the set molding material from the heat spreader mold as the heat spreader, wherein the set molding material forms at least a portion of a side wall of the first cavity and at least a portion of a side wall of the second cavity.

2. The method of claim 1, wherein the first insert includes a metal, a ceramic material or a composite material.

3. The method of claim 1, wherein the molding material includes an aluminum alloy, a zinc alloy, or a magnesium alloy.

4. The method of claim 1, wherein the molding material includes a resin or an epoxy-based composite.

5. The method of claim 1, wherein the set molding material has a modulus of elasticity that is greater than or equal to a modulus of elasticity of the first insert.

6. The method of claim 1, further comprising:
after removing the heat spreader from the heat spreader mold, plating the heat spreader with a metal.

7. The method of claim 1, further comprising:
prior to providing the first and second inserts in the heat spreader mold, forming the first and second inserts by stamping.

8. The method of claim 1, wherein providing the molding material comprises injecting the molding material in fluid form using an insert molding process.

9. A heat spreader, comprising:
a first insert having a first face and a first side, the first face positioned to form a bottom surface of a first cavity;
a second insert having a second face and a second side, the second face positioned to form a bottom surface of a second cavity and the second cavity having a depth that is different from a depth of the first cavity; and
a molding material disposed between the first and second inserts and coupled with the first side and the second side, the molding material forming at least a portion of a side wall of the first cavity and at least a portion of a side wall of the second cavity.

10. The heat spreader of claim 1, wherein the heat spreader has a footprint defined by a perimeter boundary, and a dimension of the footprint is greater than or equal to approximately 80 millimeters (mm).

11. The heat spreader of claim 2, wherein the dimension of the footprint is greater than or equal to approximately 150 mm.

12. The heat spreader of claim 1, wherein the heat spreader has a footprint defined by a perimeter boundary, and the footprint has an area greater than or equal to approximately 1600 mm2.

13. The heat spreader of claim 1, wherein the first and second inserts are included in a body portion of the heat spreader, and the heat spreader further comprises a handling tab extending from the body portion and dimensioned for manipulation by a finger of a human user.

14. The heat spreader of claim 1, wherein the first insert has a thickness, measured perpendicular to the first face, which is different from a thickness of the second insert, measured perpendicular to the second face.

15. The heat spreader of claim 1, wherein the first insert has a second face opposite from the first face of the first insert, the second insert has a second face opposite from the first face of the second insert, and the second faces of the first and second inserts are contained in a common plane.

16. The heat spreader of claim 1, wherein the molding material extends around a perimeter boundary of the heat spreader.

17. The heat spreader of claim 1, further comprising:
one or more additional inserts positioned to form bottom surfaces of corresponding one or more additional cavities.

18. The heat spreader of claim 1, wherein the first cavity is positioned within the second cavity.

19. An integrated circuit (IC) package, comprising:
a substrate;
a heat spreader having first and second cavities, the first and second cavities having respective first and second bottom surfaces, the first bottom surface defined by a first insert, the second bottom surface defined by a second insert, the first insert and the second insert being secured in the heat spreader by a molding material; and
first and second IC components coupled with a surface of the substrate and positioned between the substrate and the heat spreader, wherein portions of the first and second IC components extend into the first and second cavities, respectively, of the heat spreader.

20. The IC package of claim 11, wherein the first and second IC components are in thermal contact with the first and second bottom surfaces, respectively.

21. The IC package of claim 12, wherein a thermal interface material is disposed between the first and second IC components and the first and second bottom surfaces, respectively.

22. The IC package of claim 11, wherein:
the first IC component has a first height, measured perpendicular to the surface of the substrate, the second IC component has a second height, measured perpendicular to the surface of the substrate, and the first height is greater than the second height; and
the first cavity has a first depth, measured perpendicular to the first bottom surface, the second cavity has a second depth, measured perpendicular to the second bottom surface, and the first depth is less than the second depth.

23. The IC package of claim 11, wherein the first IC component includes a memory stack and the second IC component includes a CPU die.

24. The IC package of claim 11, wherein the substrate includes an interposer.

25. The IC package of claim 16, wherein a patch is positioned between the first IC component and the interposer.

* * * * *